United States Patent
Suzuki (10) Patent No.: US 7,081,681 B2
(45) Date of Patent: Jul. 25, 2006

(54) SEMICONDUCTOR INTEGRATED CIRCUIT DEVICE FOR PREVENTING WARPING OF AN INSULATING FILM THEREIN

(75) Inventor: Takehiro Suzuki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/418,151

(22) Filed: Apr. 18, 2003

(65) Prior Publication Data

US 2003/0197272 A1    Oct. 23, 2003

(30) Foreign Application Priority Data

Apr. 19, 2002    (JP) .............................. 2002-118522

(51) Int. Cl.
*H01L 23/48*    (2006.01)
(52) U.S. Cl. ...................... 257/784; 257/758; 257/780
(58) Field of Classification Search ........ 257/758–760, 257/774, 776, 780, 784, 786; 438/618, 622, 438/626, 637
See application file for complete search history.

(56) References Cited

U.S. PATENT DOCUMENTS

| 5,027,188 | A | * | 6/1991 | Owada et al. .............. 257/758 |
| 5,736,791 | A |   | 4/1998 | Fujiki et al. |
| 6,080,652 | A |   | 6/2000 | Yamaha et al. ............. 438/622 |
| 6,261,883 | B1 | * | 7/2001 | Koubuchi et al. .......... 438/197 |
| 6,441,467 | B1 |   | 8/2002 | Toyosawa et al. .......... 257/637 |

FOREIGN PATENT DOCUMENTS

| JP | 08-213422 | 8/1996 |
| JP | 08-264647 | 10/1996 |

OTHER PUBLICATIONS

Taiwense Office Action w/ English translation.
Korean Office Action w/ English translation.
Chinese Office Action w/ English translation.

* cited by examiner

*Primary Examiner*—Hung Vu
(74) *Attorney, Agent, or Firm*—Harness Dickey & Pierce P.L.C.

(57) ABSTRACT

By having substantially narrow pitches between wires in a first wiring layer located in an interlayer insulating layer of a semiconductor integrated circuit device, a total amount of the first wiring layer in the interlayer insulating film may be increased, thereby reducing a total amount of the interlayer insulating film having low hardness, which causes warping. As a result, stresses that are typically applied on a protective film of the semiconductor integrated circuit device due to the warping may be prevented. This may prevent the occurrence of a crack, etc. in the protective film. Therefore, it may be possible to prevent failures such as electrical disconnection of a second wiring layer above the protective film due to the crack in the protective film.

17 Claims, 4 Drawing Sheets

SEMICONDUCTOR INTEGRATED CIRCUIT DEVICE FOR PREVENTING WARPING OF AN INSULATING FILM THEREIN

FIELD OF THE INVENTION

The present invention relates to a semiconductor integrated circuit device, especially a semiconductor integrated circuit device including protruded electrodes (bump electrodes), which are formed in an active area (operation area) on a surface of a semiconductor substrate.

BACKGROUND OF THE INVENTION

Conventional semiconductor integrated circuit devices of a double metal structure have been mass produced. One semiconductor integrated circuit (IC) device of this kind is provided with an interior operation area (active area), which is to be a circuit element portion, and a pad area formed on a surface of the semiconductor IC device.

The operation area is an area in which circuit elements such as a transistor, a diode and the like, and metal wiring layer (for example a metal wiring layer made of aluminum or the like) for connecting the circuits elements with each other are formed.

The pad area is an area in which electrodes (protruded electrodes) for connecting the semiconductor IC device with an external connecting terminal is formed, and with which input and output of a signal are performed. Note that a shape and a size of the protruded electrodes depend on pitches (intervals) to be formed. For example, for use in a liquid crystal driver, the protruded electrodes having a rectangular shape having a size of 40 μm×90 μm is so formed as to have pitches in a range of 50 μm to 80 μm around the semiconductor IC device.

Moreover, usually the protruded electrodes are formed not in the operation area, but around the operation area so that, for example, stress such as mechanical pressure or thermal stress will not be applied on the operation area via the protruded electrodes in connecting the protruded electrodes with the external terminals.

Recently, the miniaturization and weight reduction (improvement to be lighter, thinner, shorter, and smaller) of electronic apparatuses such as portable phones and portable information terminals urges electronic parts for those apparatuses to be packed more densely (to be improved in terms of density). This complicates a pattern of the metal wiring layer for connecting the circuit elements with each other in the semiconductor IC device, and produces a trend of use of multilevel interconnection structure in which a plurality of metal wiring layers are layered.

This also causes the semiconductor IC device to have a number of terminals for establishing the connection with external connecting terminals that may be in a range of up to 500 to 600 terminals. This causes the pad area to be larger, thereby giving the semiconductor IC device a larger size, going against the trend of miniaturization and weight reduction in portable phones, PDA (Personal Digital Assistants) and the like.

As an art to reducing the weight of the semiconductor integrated circuit device, an art called "area pad" is suggested, in which protruded electrodes are formed in an operation area of the semiconductor IC circuit device. An example of such semiconductor IC device is disclosed in Japanese Publication of Unexamined Patent Application, Tokukaihei, No. 11-8247 (published on Jan. 12, 1999). In the semiconductor IC device, a first wiring layer and interlayer film are provided on an active element, while a second wiring layer and a barrier metal are provided under protruded electrodes in this order. Further, the interlayer film and the barrier metal are bonded together via a cohesion film (insulating film). The cohesion film has a property to attain high cohesion with the barrier metal. Thus, the barrier metal and the interlayer film are highly cohered so that the barrier metal will be hardly peeled off from a layer located below the barrier metal, for example, even if an external force such as stress caused during bonding is applied thereon. In addition, for attaining electrical connection with the protruded electrodes, a barrier metal is also provided between the protruded electrodes and the second wiring layer.

Recently, a semiconductor IC device, which is produced by using the "area pad", for liquid crystal display panels for example, is packaged (bonded) on a tape carrier (for example, a tape in which a pattern of a metal wiring is formed on an insulative film substrate. Such mounting method is called COF (Chip-ON-FPC (Flexible Printed Circuit)) method.

Figure 3:
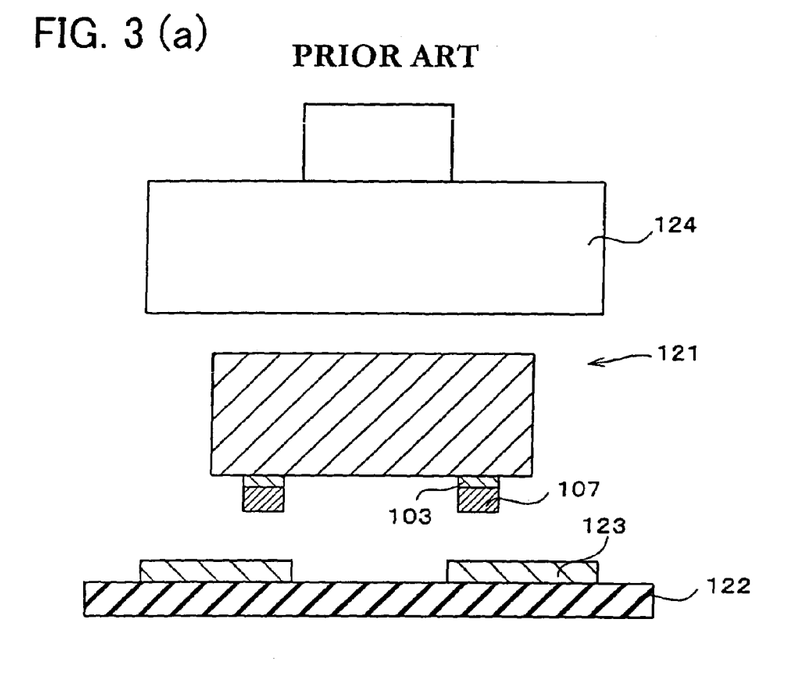

Referring to FIGS. 3(a) and 3(b), how the packaging is carried out in the COF method is explained below together with explanation on members used in the packaging. Note that FIG. 3(a) is a schematic cross-sectional view of a semiconductor IC device before connecting protruded electrodes with a metal wiring pattern by using the ILB method later described, while FIG. 3(b) is a schematic cross-sectional view of a semiconductor IC device after connecting protruded electrodes with a metal wiring pattern by using the ILB method.

As shown in FIG. 3(a), a semiconductor IC device 121 is provided with, on a surface thereof, a metal wiring layer (aluminum pad) 103, which functions as terminal electrodes for input and output. Further, the semiconductor IC device 121 is provided with protruded electrodes 107 below the metal wiring layer 103. Note that the protruded electrodes 107 are formed by plating gold (Au) on the metal wiring layer 103, and has a thickness of 10 μm–18 μm.

On the other hand, an insulative film substrate 122, on which the semiconductor IC device 121 is packaged, is provided with, on a surface thereof, a metal wiring pattern (lead frame) 123.

The insulative film substrate 122 is a member made mainly of a polyimide resin or polyester and having a belt-like shape. The insulative film substrate 122 is provided with feed holes at predetermined intervals on both edges thereof, so that the insulative film substrate 122 can be moved in its longitudinal direction.

The metal wiring pattern 123 is made of a conductive material such as copper (Cu) or the like, and tin (Sn), Au, or the like is plated on a surface of the metal wiring pattern 123. In addition, the metal wiring pattern 123 is provided with an inner lead, an outer lead, and an intermediate lead, and the like.

By using a bonding tool 124 (see FIG. 3(a)), the semiconductor IC device 121 is jointed (bonded) with the insulative film substrate 122. Specifically, as shown in FIG. 3(b), the protruded electrodes 107 and the metal wiring pattern 123 are joined by thermo compression in which the bonding tool 124 is used. Note that such a bonding method is generally known as the ILB (inner Lead Bonding).

After the ILB, even it is not illustrated here, the semiconductor IC device is sealed with a resin (resin encapsulation) by using an epoxy resin, a silicon resin or the like. In the resin encapsulation, the resin is applied around the semiconductor IC circuit by using a nozzle, and cured by heat application by the reflow method or the like. Thereafter, packaging section of the semiconductor IC device is stamped out of a tape carrier, and mounted, as individual semiconductor IC device (semiconductor package) on a liquid crystal display panel or the like.

However, in the semiconductor IC device 121 of the publication, the following problems may occur.

Figure 4:
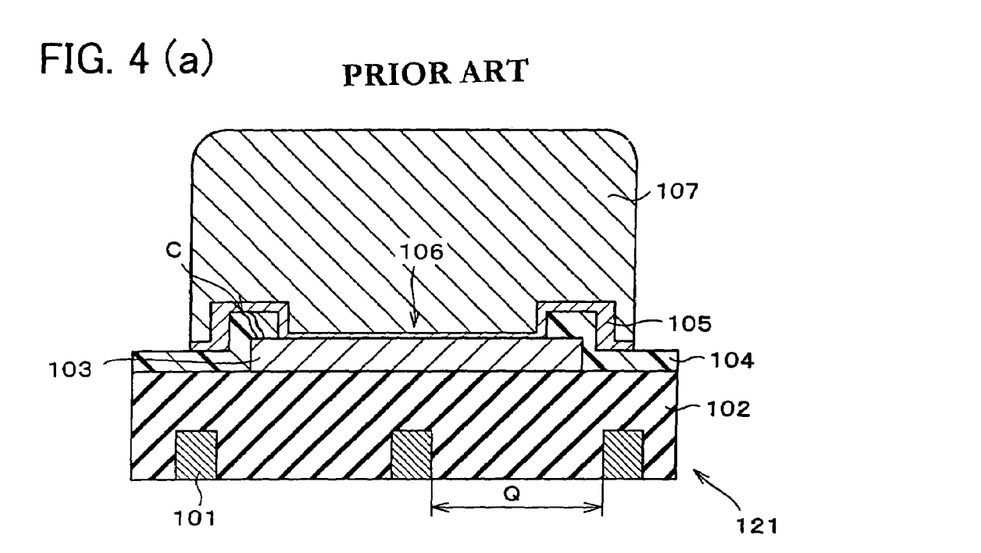

FIGS. 4(a) and 4(b) are respectively schematic cross-sectional views and plan view illustrating only main members of the semiconductor IC device 121. As shown in FIG. 4(a), the semiconductor IC device 121 is provided with, on a first wiring layer 101, an interlayer insulating film 102 for planarizing (leveling off, compensating) level-difference caused by the first wiring layer 101 (that is, level-difference caused by pitches Q of the first wiring layer 101). The interlayer insulating layer is made mainly of a soft material such as SOC (Spin-On-Glass).

Moreover, on the interlayer insulating film 102, a metal wiring layer (second wiring layer) 103 is provided. A protective film 104 is provided on the second wiring layer 103 so that the whole second wiring layer 103 except part thereof in which a window section 106 is provided is covered with the protective layer 104. Further, the second wiring layer 103 is electrically connected with the protruded electrodes 107 via the barrier metal 105 provided on the protective film 104 and the window section 106.

Here, in connecting the protruded electrodes 107 with a metal wiring pattern (external connecting terminal), that is, in bonding the protruded electrodes 107 with the external connecting terminal, there is a possibility that stress will be applied on the protruded electrodes 107 thereby making a crack C in the protective film 104 on the second wiring layer 103. Further, there is possibility that the crack C will be widened thereby allowing water to invade therein and cause corrosion, and finally causing such failure as electrical disconnection.

The crack C is caused because the interlayer insulating film 102 made of SOG, which is soft (has low hardness), is bent when stress is applied on the protruded electrodes 107, or when stress is applied on the second wiring layer 103. Especially, the warping is prominent when no first wiring layer 101 is provided.

SUMMARY OF THE INVENTION

The exemplary embodiments of the present invention may provide a semiconductor IC device having high reliability, by alleviating warping of an interlayer insulating film so as to prevent cracking a protective film on application of stress on a protruded electrode in packaging (in bonding) in order to prevent failure such as electrical disconnection and the like.

In order to solve the foregoing problems, a semiconductor integrated circuit device of the present invention includes (i) a first wiring layer in which a plurality of wires electrically connected with an operation area are aligned, (ii) a second wiring layer formed on an interlayer insulating film with which the first wiring layer is coated, and (iii) protruded electrodes provided on the second wiring layer, the protruded electrodes being so formed as to at least partially overlap the operation area, and being for establishing external electrical connection, wherein the wires right under the protruded electrodes are so aligned as to have such pitches as to prevent warping of the interlayer insulating film due to pressure application in connecting the protruded electrodes with external connecting terminals.

The semiconductor integrated circuit device (semiconductor IC device) having the above arrangement is provided with (i) the operation area including an active element (such as transistor), and (ii) the first wiring layer including wires electrically connected with the operation area. Further, the semiconductor IC device is provided with the second wiring layer for establishing electrically connection with the first wiring layer, the second wiring layer and the first wiring layer sandwiching the interlayer insulating film. Such semiconductor IC device is mounted (bonded) as a semiconductor chip, for example, in a tape carrier including a lead frame, and the like, in order to make an semiconductor package.

In such packaging, when the semiconductor IC device is pressed, for example on the tape carrier, an external force (pressure) is applied on the interlayer insulating film. Consequently, the external force warps an interlayer insulating film that is made of a soft material, for example.

However, the semiconductor IC device of the present invention has substantially narrow pitches between wires right under the protruded electrodes, because right under the protruded electrodes, a substantial pressure is applied in connecting the protruded electrodes with the external connective terminals. This arrangement may prevent the warping of the interlayer insulating film. For example, it is so arranged that the pitches between wires of the first wiring layer (inter-wire spaces) may be narrower than conventional pitches between wires. This arrangement may increases volume (total amount) of the first wiring layer compared with the interlayer insulating film around the first wiring layer, which is provided in the interlayer insulating film, thereby reducing a volumetric ratio of the interlayer insulating film around the first wiring layer to the first wiring layer, as compared with the volumetric ratio of the conventional interlayer insulating film. In short, by having narrower inter-wire spaces in the first wiring layer, the amount (total amount) of the interlayer insulating film is decreased around the first wiring layer, which is provided in the interlayer insulating film.

Therefore, for example, it is possible to reduce the volumetric ratio of the soft material in the area in which wires of the first wiring layer are provided with such narrow pitches. Thus, the warping of the interlayer insulating film of the semiconductor IC device is smaller than that of the conventional interlayer insulating film. As a result, for example, stress due to the warping of the interlayer insulating film, and like will not be applied on the protective film and the like provided on the interlayer insulating film. This prevents occurrence of a crack and the like in the protective film. Therefore, it is possible to prevent failure such as electrical disconnection in the second wring layer due to the crack and the like in the protective film, thereby giving high reliability to the semiconductor IC device of the present invention.

Moreover, in order to solve the foregoing problems, a semiconductor integrated circuit device of the present invention includes (i) a first wiring layer in which a plurality of wires electrically connected with an operation area are aligned, (ii) a second wiring layer formed on an interlayer insulating film with which the first wiring layer is coated, (iii) protruded electrodes provided on the second wiring layer, the protruded electrodes being so formed as to at least partially overlap the operation area, and being for establishing external electrical connection, the semiconductor integrated circuit device further including pseudo wires, respectively at least right under the protruded electrodes, for reinforcing the interlayer insulating film in strength.

In this arrangement, the pseudo wires electrically disconnected with the operation area are respectively provided right under the protruded electrodes, because right under the protruded electrodes, a large pressure is especially applied in connecting the protruded electrodes with the external connective terminals. Thus, the warping of the interlayer insulating film of the semiconductor IC device is smaller than that of the conventional interlayer insulating film. As a result, for example, stress due to the warping of the interlayer insulating film, and like will not be applied on the protective film and the like provided on the interlayer insulating film. This prevents occurrence of a crack and the like in the protective film. Therefore, it is possible to prevent failure such as electrical disconnection in the second wring layer due to the crack and the like in the protective film.

For a fuller understanding of the nature and advantages of the invention, reference should be made to the ensuing detailed description taken in conjunction with the accompanying drawings.

BRIEF DESCRIPTION OF THE DRAWING

FIG. 1(a) is a schematic cross-sectional view (taken on line A—A of FIG. 2 later described) illustrating main members of a semiconductor IC device, while FIG. 1(b) is a schematic plan view of FIG. 1(a).

FIG. 3(a) is a schematic cross-sectional view of a semiconductor IC device before connecting protruded electrodes and a metal wiring pattern by the ILB method, while FIG. 3(b) is a schematic cross-sectional view of the semiconductor IC device after connecting the protruded electrodes and the metal wiring pattern by the ILB method.

FIG. 4(a) is a schematic cross-sectional view illustrating main members of a conventional semiconductor IC device, while FIG. 4(b) is a schematic plan view of FIG. 4(b).

DESCRIPTION OF THE EMBODIMENTS

Figure 1:
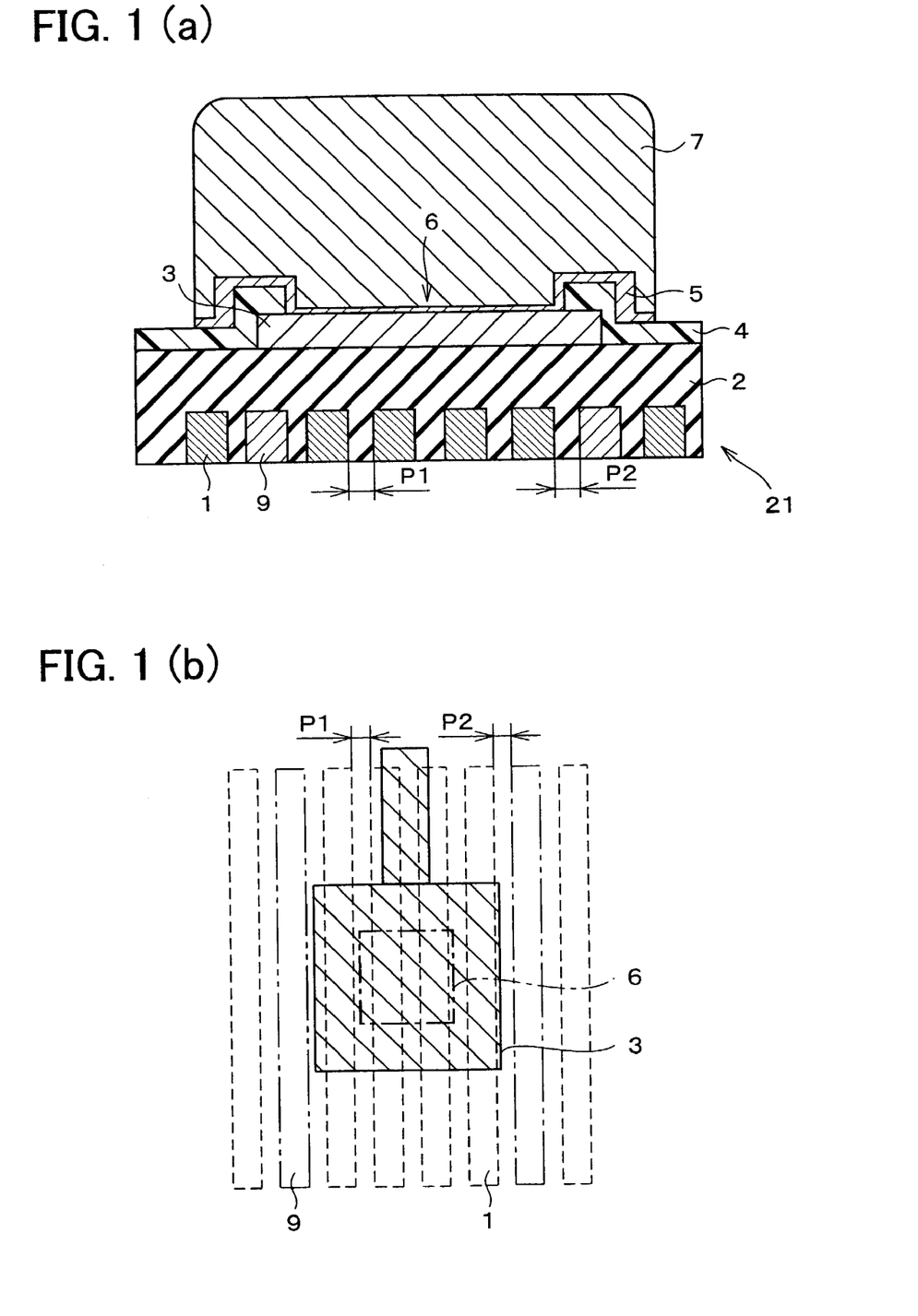
Figure 2:
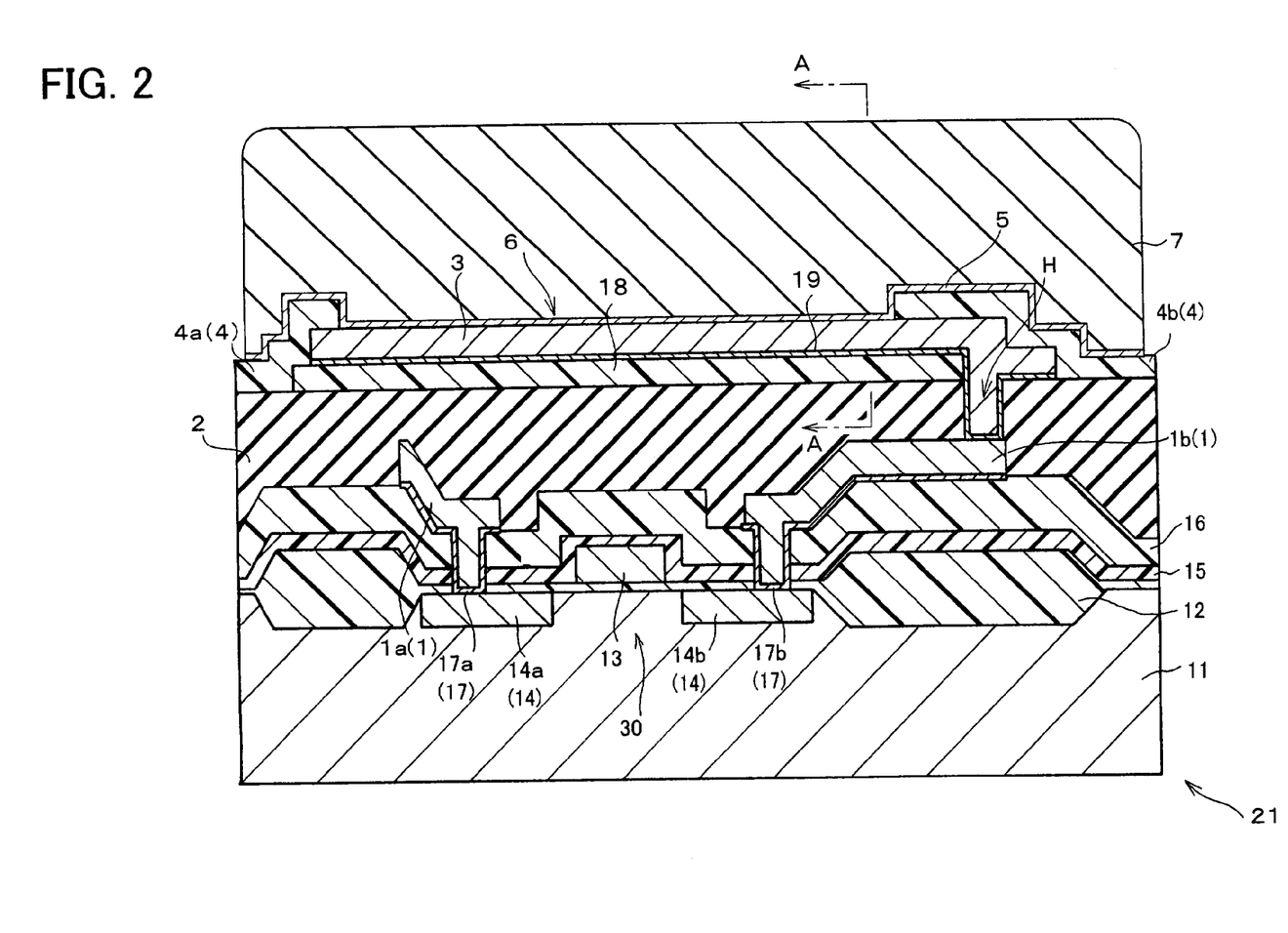
FIG. 2 is a detailed cross-sectional view of the semiconductor IC device of FIG. 1(a).

Referring to FIGS. 1(a), 1(b) and 2, an embodiment of the present invention is explained below. Note that the present invention is not limited to the embodiment.

In a semiconductor IC device 21 of the present embodiment is, as shown in FIG. 2, a silicon oxide film (semiconductor substrate) 12 is formed in a silicon substrate (semiconductor substrate) 11 including a diffusion layer 14 (14a, 14b). On the silicon oxide film 12, a conductive layer to be a gate electrode, for example, a polysilicon film (semiconductor substrate) 13 is formed.

On the silicon oxide film 12 and the polysilicon film 13, for example a CVD-silcon oxide film 15, which is formed by the low-pressure CVD method, and a BPSG (Boron Phosphorous Silicate Grass) film 16 are deposited in this order. In the CVD-silcon oxide film 15 and BPSG film 16, a contact hole is formed. A barrier metal 17 (17a, 17b) and a first wiring layer 1 (1a and 1b) are so formed as to pierce through the contract hole. The barrier metal 17 is made of titanium tungsten, or the like, for example, while the first wiring layer 1, which is a metal wiring, is made of an aluminum alloy such as aluminum silicon, aluminum, or the like, for example. In this way, an active element 30 is formed.

Moreover, on the BPSG film 16 and the first wiring layer (metal wiring) 1, an interlayer insulating film 2 is formed. The interlayer insulating film 2 is made of, for example, SOG (Spin-On-Glass), or the like, and functions as a level-difference compensating film for compensating level difference that occurs in the first wiring layer 1.

Further, on the interlayer insulating film 2, for example, a barrier metal (barrier metal layer) 19 is so formed as to have an insulating film 18 is sandwiched between the interlayer insulating film 2 and the barrier metal 19. The barrier metal 19 functions a metal wiring layer of protruded electrodes 7, and is made of titanium tungsten or the like. On the barrier metal 19, a second wiring layer (pad metal) 3, which is constituted of aluminum, an aluminum alloy or the like. Note that it may be so arranged that no insulating film 18 is provided, even though it is preferable that the insulating film 18 is provided.

Moreover, on predetermined part of the second wiring layer 3, a protective film 4 (4a, 4b) made of PSG (Phosphorous Silicate Glass), a silicon nitride film or the like is formed. In the present embodiment, as shown in FIG. 2, a window section (SR window section) of the protective film (passivation film) 4 (4a, 4b) is so formed with, for example, a 2.5 µm to 10 µm margin from an edge of the second wiring layer 3.

Moreover, on the second wiring layer 3, and the protective film 4 (4a and 4b), formed is a barrier metal 5 made of metal having high melting point, such as titanium, tungsten, or the like. Formed on the barrier metal 5 is the protruded electrodes 7 for electrical connection with a lead frame (not shown).

Here, how the semiconductor IC device 21 is manufactured is explained. Firstly, the silicon oxide film 12 is formed on the silicon substrate 11. Then, a polysilicon film 13 is formed on the silicon oxide film 12 so as to form the gate electrode. Next, a diffusion layer 14 (14a, 14b) is formed in the silicon substrate 11. Then, via the low-pressure CVD method, the CVD-silicon oxide film 15 is formed. After that, the BPSG film 16 is formed at normal pressures. Then, photo etching of the CVD-silicon oxide film 15 and the BPSG film 16 is carried out so as to form a contact hole.

Thereafter, via the sputtering method, the barrier metal 17 (17a, 17b) and the first wiring layer 1 are formed. Then, the barrier metal 17 (17a, 17b) and the first wiring layer 1 are fabricated into a necessary wiring shape via the dry etching.

Then, the interlayer insulating film 2 is formed on top of the BPSG film 16 and the first wiring layer 1. In other words, for example via the CVD method (Chemical Vapor Deposition method), a silicon oxide film is formed and then a SOG film is formed on a whole surface of the silicon oxide film via spin coating (coating method). After that, a whole surface of the SOG film is etched via a technology called etchback, so as to leave the SOG film on only in recess portion of the silicon oxide film and to planarize the surface. Further, a silicon oxide film is formed again thereon via the CVD method, so as to form the interlayer insulating film 2. Then, via the Plasma enhanced CVD method, the insulating film 18 made for example of a silicon nitride, which has a property to closely cohere with the barrier metal 19, is formed on the interlayer insulating film 2.

Next, a through hole H is so formed as to pierce the interlayer insulating film 2 and the insulating film 18 through. Then, the barrier metal 19 and the second wiring layer 3 is formed as wires.

Thereafter, for example, in case a bonding method using the ILB method is applied, the barrier metal 5 is formed on the second wiring layer 3 and the protective film 4 (4a and 4b) via the sputtering method. Then, the protruded electrodes 7 are formed on the barrier metal 5 via the electroplating method.

In the following, the semiconductor IC device of the present embodiment is explained referring to FIG. 1(a), and 1(b) (cross-sectional view taken on line A—A of FIG. 2), which illustrate the semiconductor IC device 21 schematically.

In the semiconductor IC device 21, as shown in FIGS. 1(a) and 1(b), the second wiring layer 3 is so formed on the first wiring layer 1 as to have the interlayer insulating film 2 therebetween. On the second wiring layer 3, the protective film 4 is formed. The protective film 4 has a window section 6. Further, between the protruded electrodes 7 and the protective film 4, the barrier metal 5 is formed. Then, the protruded electrodes 7, the barrier metal 5, and the second wiring layer 3 are electrically connected with each other.

In the semiconductor IC device 21 of the present embodiment, pitches between wires (inter-wire spaces P1) in the first wiring layer 1 located in the interlayer insulating film 2 are so narrow. In short, quantitative percentage of the first wiring layer 1 in the interlayer insulating film 2 is increased so as to reduce (cut down) a total amount of the interlayer insulating film 2, (which, for example, has low hardness and may cause warping) around the first wiring layer 1.

It is preferable that the inter-wire spaces P1 are 1.5 μm or less. This numeral value was worked out by evaluation in which the semiconductor IC device 21 was actually packaged via the COF method and evaluated as to whether or not the crack C occurred in the protective film 4 on the second wiring layer 3. The evaluation showed that the crack C occurred with a probability of 90% or higher when the inter-layer spaces P1 were 3.6 μm, while the crack C occurred with a probability of about 20% when the inter-wire spaces P1 were 2.1 μm. However, when the inter-wire spaces P1 were 1.5 μm, the probability of the occurrence of the crack C was 0%. Thus, this numeral value is adopted.

As described above, in the semiconductor IC device 21 of the present embodiment, the first wiring layer 1 provided below (right below) the protruded electrodes 7 has the narrow inter-wire spaces P1, and it is preferable that the inter-wire spaces P1 are 1.5 μm or less.

As described above, when the semiconductor IC device 2 is formed with such inter-wire spaces P1, it is possible to reduce the amount of the interlayer insulating film 2, which is warped by stress (pressuring and the like) in connecting the metal wiring pattern (lead frame; see FIGS. 3(a) and 3(b)) with the protruded electrodes 7 via the COF method. In other words, when it is regarded that the first wiring layer 1, which is so formed as to have narrow pitches as shown in FIG. 1(a), corresponds to, for example, a metal wiring layer having high hardness spread over a bottom surface of the interlayer insulating film 2, the interlayer insulating film 2 of the present embodiment has a thinner thickness than the conventional interlayer insulating film 102 (see FIG. 4(a)) in a pseudo manner (apparently). Such reduction in thickness means that the amount of the interlayer insulating film 2 is reduced. Thus, generally, the smaller the amount of the interlayer insulating film 2 is, the smaller an amount of the warping of the interlayer insulating film 2 becomes, compared with the conventional interlayer insulating film 102. As a result, it is possible to prevent the occurrence of the crack C (see FIG. 4(a)) in the protective film 4 due to the warping of the interlayer insulating film 2.

Therefore, for example, it is possible to prevent corrosion caused by invasion of water in the second wiring layer 3 due to the widening of the crack C in the protective film 4, or flow of current through an area of the second wiring layer 3, in which water invaded.

In short, the semiconductor IC device of the present invention has such an arrangement that the wires and dummy wires 9 of the first wiring layer 1, which are located in the interlayer insulating film 2, are provided with narrow intervals so as to have a smaller amount of the interlayer insulating film 2 than conventional interlayer insulating films.

Moreover, for example when the first wiring layer 1 is formed not to be located below (right below) the second wiring layer 3, the semiconductor IC device 21 of the present embodiment may be so arranged that the dummy wires (pseudo wires) 9 are provided, the dummy wire 9 being electrically disconnected. Further, the semiconductor IC device 21 of the present embodiment may be so arranged that the first wiring layer 1 is formed not under the second wiring layer.

In other words, the provision of the dummy wires 9 causes inter-wire spaces P2 (intervals between the dummy wires 9 and the wires of the first wiring layer 1) to be narrower. Note that it is also preferable that the inter-wire spaces P2 are 1.5 μm or less, similarly to the inter-wire spaces P1.

The dummy wires 9 work as reinforcing structures to give strength to the interlayer insulating film 2 in part of the interlayer insulating film 2 in which pressure is especially applied, that is, the part of the interlayer insulating film 2 right below the protruded electrodes 7, in which the pressure is especially applied in connecting the external connecting terminals with the protruded electrodes 7. This renders the amount of warping in the interlayer insulating film compared with the conventional one, thereby preventing occurrence of the crack in the protective film 4 provided on the interlayer insulating film 2. Thus, the rate of occurrence of the crack C in the protective film 4 is reduced, thereby reducing failure, such as electrical disconnection.

Note that the inter-wire space P1 between the wires of the first wiring layer 1 and the inter-wire space are narrow, preferably 1.5 μm or less. In the semiconductor IC device of the present embodiment, the members for reinforcing the strength of the interlayer insulating film 2 is provided only for reducing the warping of the interlayer insulating film 2 compared with the conventional one.

It is preferable that at least one kind (group) of (i) the inter-wire space P1 between the wires of the first wiring layer 1, (ii) the inter-wire space P2 between the dummy wires 9 and the first wiring layer 1, and (iii) a space (not shown) between the dummy wires 9 are 1.5 μm or less, and it is more preferable that all of the three kinds (groups) of spaces are less than 1.5 μm or less.

Moreover, where the interlayer insulating film 2 has a thickness of about 1350 nm, and the first wiring layer 1 has a thickness of about 900 nm, it is preferable that the inter-wire spaces are 1.5 μm or less.

Moreover, especially, it is preferable that the thickness of the interlayer insulating film 2 is about 450 nm right under the protruded electrodes 7, that is, on top of the first wiring layer 1, and the first wiring layer 1 right under the part of the interlayer insulating film 2 having such thickness has a thickness of about 900 nm. In short, a volumetric ratio of the interlayer insulating film 2 right under the protruded electrode 7 to the first wiring layer 1 is equivalent to a ratio of them in terms of thickness.

Moreover, the dummy wires 9 are not limited particularly in terms of raw materials, and may be made of any material, as long as the material has high hardness.

Moreover, the semiconductor IC device 21 of the present embodiment is provided with, on the second wiring layer 3, the protruded electrodes 7 for connection with the external connecting terminals via the barrier metal 5. The protruded electrodes 7 have an area larger than that of the second wiring layer 3.

Moreover, the semiconductor IC device of the present invention can suppress the warping of the interlayer insulating film 2, even if the interlayer insulating layer 2 is made of a soft material such as the SOG, for example.

Moreover, the semiconductor IC device may be described as follows.

A semiconductor integrated circuit device is provided with (i) an operation area, in which a semiconductor element (circuit element) is provided, (ii) a semiconductor substrate, (iii) a first wiring layer in which a plurality of wires electrically connected with an operation area are aligned, (iv) a second wiring layer formed on an interlayer insulating film with which the first wiring layer is coated, and (v) protruded electrodes provided on the second wiring layer, the protruded electrodes being so formed as to at least partially overlap the operation area, and being for establishing external electrical connection, wherein the first wiring layer right under the protruded electrodes have narrow pitches.

Moreover, the semiconductor integrated circuit device is so arranged that the inter-wire spaces in the first wiring layer right under the second wiring layer (the electrode pad of the second wring layer; pad metal) are 1.5 µm or less.

Furthermore, the semiconductor integrated circuit device, in which the first wiring layer is not provided right under the second wiring layer, is so arranged as to include a dummy wiring layer.

Further, the semiconductor integrated circuit device is so arranged that the spaces between the dummy wires are 1.5 µm or less.

Moreover, the semiconductor integrated circuit device is so arranged that the protruded electrodes have an area greater than that of the second wiring layer (electrode pad).

As described above, a semiconductor integrated circuit device of the present invention includes (i) a first wiring layer in which a plurality of wires electrically connected with an operation area are aligned, (ii) a second wiring layer formed on an interlayer insulating film with which the first wiring layer is coated, and (iii) protruded electrodes provided on the second wiring layer, the protruded electrodes being so formed as to at least partially overlap the operation area, and being for establishing external electrical connection, wherein the wires right under the protruded electrodes are so aligned as to have such pitches as to prevent warping of the interlayer insulating film due to pressure application in connecting the protruded electrodes with external connecting terminals.

According to this arrangement, for example, it is possible to reduce a volumetric ratio of the soft material in the area in which wires of the first wiring layer are provided with such narrow pitches. Thus, the warping of the interlayer insulating film of the semiconductor IC device is smaller than that of the conventional interlayer insulating film. As a result, for example, stress due to the warping of the interlayer insulating film, and like will not be applied on the protective film and the like provided on the interlayer insulating film. This prevents occurrence of a crack and the like in the protective film. Therefore, it is possible to prevent failure such as electrical disconnection in the second wring layer due to the crack and the like in the protective film, thereby giving high reliability to the semiconductor IC device of the present invention.

Moreover, in addition to the above arrangement, the semiconductor integrated circuit device of the present invention is preferably arranged that the pitches are 1.5 µm or less.

This arrangements attains such first wiring layer as to have narrow pitches, thereby increasing a total amount of the metal wires in the interlayer insulating film, thus reducing the total amount of the interlayer insulating film, compared with the conventional interlayer insulating film.

Furthermore, a semiconductor integrated circuit device of the preset invention including (i) a first wiring layer in which a plurality of wires electrically connected with an operation area are aligned, (ii) a second wiring layer formed on an interlayer insulating film with which the first wiring layer is coated, and (iii) protruded electrodes provided on the second wiring layer, the protruded electrodes being so formed as to at least partially overlap the operation area, and being for establishing external electrical connection, the semiconductor integrated circuit device further including pseudo wires, respectively at least right under the protruded electrodes, for reinforcing the interlayer insulating film in strength.

According to this arrangement, the pseudo wires electrically disconnected with the operation area are respectively provided right under the protruded electrodes, because right under the protruded electrodes, a large pressure is especially applied in connecting the protruded electrodes with the external connective terminals. Thus, the warping of the interlayer insulating film of the semiconductor IC device is smaller than that of the conventional interlayer insulating film. As a result, for example, stress due to the warping of the interlayer insulating film, and like will not be applied on the protective film and the like provided on the interlayer insulating film. This prevents occurrence of a crack and the like in the protective film. Therefore, it is possible to prevent failure such as electrical disconnection in the second wring layer due to the crack and the like in the protective film.

Further, in addition to the above arrangement, the semiconductor integrated circuit device of the present invention is preferably arranged such that at least one group of (i) pitches between the pseudo wires and the wires, (ii) pitches between the wires, and (iii) pitches between the pseudo wires are 1.5 µm or less.

This arrangement, in which the wires and the dummy wires of the first wiring layer having the narrow pitches are provided in the interlayer insulating film, thereby reducing the total amount of the interlayer insulating film compared with the conventional interlayer insulating film.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed:

1. A semiconductor integrated circuit device, comprising:
    a first wiring layer coated with an insulating film and including a plurality of wires electrically connected with an operation area and a plurality of pseudo wires which extend continuously through the first wiring layer, the wires and pseudo wires aligned in parallel with each other and coated with the insulating film;
    a second wiring layer formed on the insulating film, wherein each of the pseudo wires extend continuously through the insulating film so as not to terminate or be truncated under the second wiring layer;
    a plurality of protruded electrodes provided on the second wiring layer and configured to establish external electrical connections, the continuous pseudo wires providing structural strength to at least a portion of the insulating film directly beneath a given protruding electrode to prevent warping of the insulating film due to a pressure applied in connecting external connecting terminals with the protruded electrodes.

2. The device of claim 1, wherein the pseudo wires are made of a material having high hardness.

3. The device of claim 1, wherein at least one group of (i) pitches between the pseudo wires and the wires of the first wiring layer, (ii) pitches between the wires of the first wiring layer, and (iii) pitches between the pseudo wires are 1.5 µm or less.

4. The device of claim 3, wherein all groups (i) to (iii) have pitches of 1.5 µm or less.

5. The device of claim 1, wherein the protruded electrodes are formed so as to at least partially overlap the operation area.

6. The device of claim 1, wherein the thickness of the interlayer insulating film on top of the first wiring layer and directly under the protruded electrode is 450 nm.

7. The semiconductor integrated circuit device as set forth in claim 1, wherein:
   at least one group of (i) pitches between the pseudo wires and the wires of the first wiring layer, (ii) pitches between the wires of the first wiring layer, and (iii) pitches between the pseudo wires is smaller than a width of each wire.

8. The semiconductor integrated circuit device as set forth in claim 7, wherein:
   all groups of (i) pitches between the pseudo wires and the wires of the first wiring layer, (ii) pitches between the wires of the first wiring layer, and (iii) pitches between the pseudo wires are smaller than the width of each wire.

9. A circuit device, comprising,
   a first wiring layer coated with an insulating film, the first wiring layer including a plurality of wires and a plurality of continuous dummy wires arranged in the same plane as the wires of the first wiring layer and coated with the insulating film,
   a second wiring layer provided on the insulating film so as to sandwich the insulating film between the first and second wiring layers, wherein each of the dummy wires extend continuously through the insulating film so as not to terminate or be truncated under the second wiring layer, and
   at least one bump electrode on the second wiring layer for electrical connection to an external terminal, wherein the continuous dummy wires provide structural strength to at least a portion of the insulating film, the wires of the first wiring layer and one or more of the dummy wires are aligned, in parallel adjacent relation directly beneath the at least one bump electrode, so as to have a substantially narrow spacing between adjacent wires to reduce the thickness of a portion of the insulating film that is directly beneath the at least one bump electrode to prevent warping of the insulating film due to a pressure applied when connecting the external terminal with the at least one bump electrode.

10. The device of claim 9, wherein the reduced thickness of the insulating film beneath the at least one bump electrode, due to an increased width of one or both of the wires of the first wiring layer and the dummy wires, reduces the likelihood of the insulating film beneath the bump electrode warping during a process of bonding the bump electrode to external terminals.

11. The device of claim 9, wherein the wires of the first wiring layer are connected with an operation area, and the electrode is formed so as to at least partially overlap the operation area.

12. The device of claim 9, wherein the thickness of the interlayer insulating film on top of the first wiring layer and directly under the at least one bump electrode is 450 nm.

13. The semiconductor integrated circuit device as set forth in claim 9, wherein:
   at least one group of (i) pitches between the pseudo wires and the wires of the first wiring layer, (ii) pitches between the wires of the first wiring layer, and (iii) pitches between the pseudo wires is smaller than a width of each wire.

14. The semiconductor integrated circuit device as set forth in claim 13, wherein:
   all groups of (i) pitches between the pseudo wires and the wires of the first wiring layer, (ii) pitches between the wires of the first wiring layer, and (iii) pitches between the pseudo wires are smaller than the width of each wire.

15. A circuit device, comprising,
   a first wiring layer including a plurality of electrically connected wires and a plurality of dummy wires each continuously extending through the first wiring layer of the device and arranged in substantially close parallel relation to one another in the same plane, the first wiring layer with the electrically-connected wires and dummy wires coated with an insulating film,
   at least one bonding pad provided on the insulating film, the continuous electrically-connected and dummy wires extending beyond edges of the bonding pad, wherein each of the dummy wires extend continuously through the insulating film so as not to terminate or be truncated under the at least one bonding pad, and
   at least one bump electrode provided on the at least bonding pad for external electrical connections,
   wherein the continuous dummy wires provide structural strength to the insulating film, and the electrically-connected wires and dummy wires of the first wiring layer arranged directly beneath the at least one bump electrode have substantially narrow spacing between adjacent wires to reduce the thickness of a portion of the insulating film that is directly beneath the at least one bump electrode, the combination of the continuous dummy wires and narrow spacing between adjacent wires prevent warping of the portion of the insulating film beneath the at least one bump electrode due to a pressure applied when connecting an external terminal thereto.

16. The semiconductor integrated circuit device as set forth in claim 15, wherein:
   at least one group of (i) pitches between the pseudo wires and the wires of the first wiring layer, (ii) pitches between the wires of the first wiring layer, and (iii) pitches between the pseudo wires is smaller than a width of each wire.

17. The semiconductor integrated circuit device as set forth in claim 16, wherein:
   all groups of (i) pitches between the pseudo wires and the wires of the first wiring layer, (ii) pitches between the wires of the first wiring layer, and (iii) pitches between the pseudo wires are smaller than the width of each wire.

* * * * *